United States Patent [19]

Rast

[11] 4,078,212

[45] Mar. 7, 1978

[54] DUAL MODE FREQUENCY SYNTHESIZER FOR A TELEVISION TUNING APPARATUS

[75] Inventor: Robert Morgan Rast, Mercerville, N.J.

[73] Assignee: RCA Corporation, New York, N.Y.

[21] Appl. No.: 758,294

[22] Filed: Jan. 10, 1977

Related U.S. Application Data

[63] Continuation of Ser. No. 662,096, Feb. 27, 1976, abandoned.

[51] Int. Cl.$^2$ .............................................. H04B 1/16
[52] U.S. Cl. .................................. 325/421; 325/453; 325/464; 325/468; 358/191
[58] Field of Search ............................. 325/418–421, 325/423, 453, 457, 459, 464, 465, 468, 470; 334/14–16; 358/191, 195

[56] References Cited

U.S. PATENT DOCUMENTS

| 3,821,650 | 6/1974 | Kase et al. | 325/423 |
|---|---|---|---|
| 3,839,678 | 10/1974 | Bell | 325/468 |
| 3,883,807 | 5/1975 | Alberkrack | 325/420 |
| 3,913,020 | 10/1975 | Van Anrooy | 325/453 |
| 3,949,305 | 4/1976 | McClaskey et al. | 325/421 |
| 4,025,953 | 5/1977 | Sideris | 358/191 |

OTHER PUBLICATIONS

IEEE Transaction on Consumer Electronics on "Simplified TV Tuning System" by Hilliker, pp. 61-68, 1-1976.

*Primary Examiner*—Robert L. Griffin
*Assistant Examiner*—Jin F. Ng
*Attorney, Agent, or Firm*—Eugene M. Whitacre; Paul J. Rasmussen; Peter M. Emanuel

[57] ABSTRACT

Television tuning apparatus includes a first phase locked loop configuration for tuning a local oscillator to a nominal frequency appropriate for converting a standard radio frequency carrier allocated to a selected channel to a predetermined intermediate frequency (e.g., 45.75 MHz) and a second phase locked loop configuration for tuning the local oscillator to minimize any deviation between the actual frequency of the I.F. picture carrier and its nominal frequency which may occur, for example, because the receiver is coupled to a distribution system utilizing frequency conversion apparatus which provides nonstandard radio frequency carriers arbitrarily near respective standard frequency carriers. The two phase locked loop configurations include common elements and control apparatus to selectively initiate the operation of one loop while inhibiting the operation of the other in accordance with a predetermined tuning algorithm.

19 Claims, 11 Drawing Figures

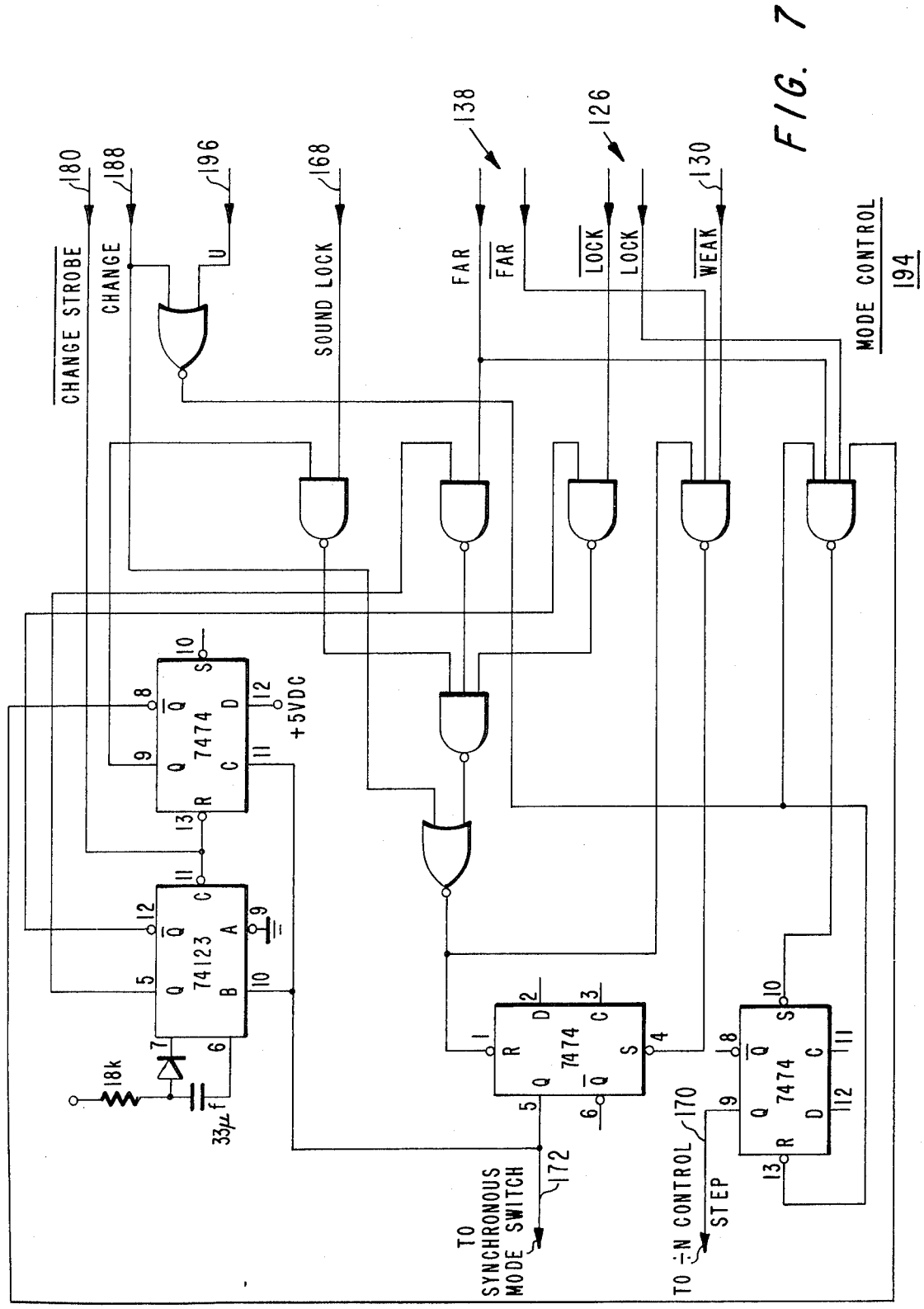

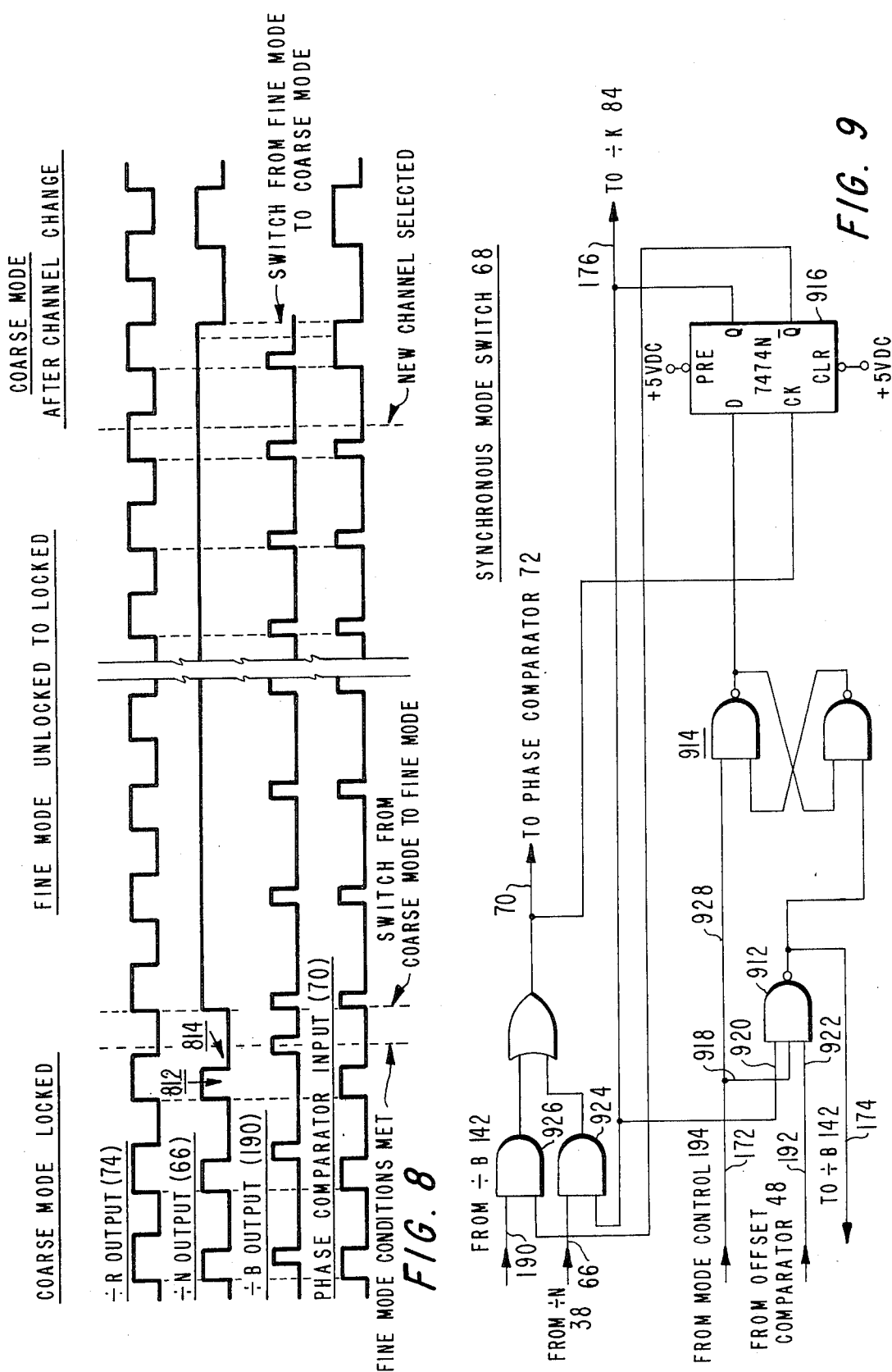

DUAL MODE FREQUENCY SYNTHESIZER FOR A TELEVISION TUNING APPARATUS

This is a continuation, of application Ser. No. 662,096, filed Feb. 27, 1976.

The present invention is directed to television channel tuning apparatus and is particularly directed to such apparatus including a frequency synthesizer.

Recently, frequency synthesizers including a phase locked loop (PLL) have been suggested to accurately general local oscillator signals at predetermined frequenices appropriate for receiving the various broadcast channels which a viewer may select. For example, tuning apparatus utilizing a phase locked loop is described in the Digital Integrated Circuits Application Note ICAN-6716 entitled, "Low-Power Digital Frequency Synthesizer Utilizing COS/MOS IC's", by R. E. Funk appearing in the 1972 RCA solid State Databook on COS/MOS Digital Integrated Circuits (SSD-203) published by RCA Corporation.

One type of PLL for television tuning apparatus, described in detail in U.S. Pat. No. 3,821,650, is controlled by a tuning voltage obtained from a phase detector responsive to differences between the picture carrier of the intermediate frequency (I.F.) signal and a reference frequency. The control loop is broken when changing channels to selectively drive the tuning voltage upward or downward until the next channel is reached. At that time, the I.F. signal is again coupled to the phase detector to maintain tuning to the newly selected channel. Provision is also made to distinguish between video carrier and audio carriers to prevent erroneous tuning of the circuit to an audio carrier.

Although such frequency synthesizer apparatus is known for tuning to standard frequency broadcast carriers, not all television signals are transmitted on standard broadcast frequencies. In some television distribution systems, such as those using community antennas (CATV) or in apartment house and motel (MATV) installations, television signals are coupled to the receivers through cables. In these cable systems, the information modulated on a standard broadcast carrier may be translated in frequency before being coupled to a receiver. The resulting carrier may not meet FCC frequency standards, e.g., in an MATV environment the error may be as much as ±2 MHz of the standard carrier frequency. It is therefore desirable to provide apparatus for tuning receivers to nonstandard frequency carriers as well as to standard frequency carriers. One such type of apparatus is described in U.S. Patent Application Ser. No. 632,060, filed on Nov. 14, 1975, now abandoned, in the name of John G. N. Henderson, which application is assigned to the same assignee as the present invention.

In accordance with the present invention, tuning apparatus for tuning a television receiver to a radio frequency carrier associated with a channel includes two phase locked loop configurations. A portion of the first loop includes controlled oscillator means for generating a local oscillator signal having a frequency $f_{LO}$. A portion of the second loop includes mixer means for deriving an intermediate frequency signal including a picture carrier. A common portion of the first and second phase locked loops includes a phase comparator and a reference frequency source coupled to an input of the phase comparator. Switching control means responsive to said local oscillator signal and to said intermediate frequency signal selectively provides either a first signal whose frequency equals the frequency of the local oscillator signal divided by a first number corresponding to the selected channel or a second signal including a frequency component proportional to said intermediate frequency picture carrier to the second input of the phase comparator. The ratio of the frequency of the local oscillator signal and the first number being substantially equal to a nominal value of said frequency component. Means are provided to generate a clock control signal when the signals coupled to the inputs of the phase comparator are in a predetermined phase and frequency relationship and to generate a near control signal when the frequency converted picture carrier is within a predetermined frequency deviation from its nominal value.

The switching control means initially couples the first signal to the phase comparator and a first phase locked loop configuration is closed for tuning the frequency of the local oscillator signal to the nominal frequency appropriate for receiving the standard frequency radio frequency carrier allocated to the selected channel. Thereafter, the switching control means substitutes the second signal in response to the presence of all of the control signals and a second phase locked loop configuration is closed for tuning the local oscillator to minimize any deviation between the frequency of the frequency converted picture carrier and its nominal value.

Figure 1:
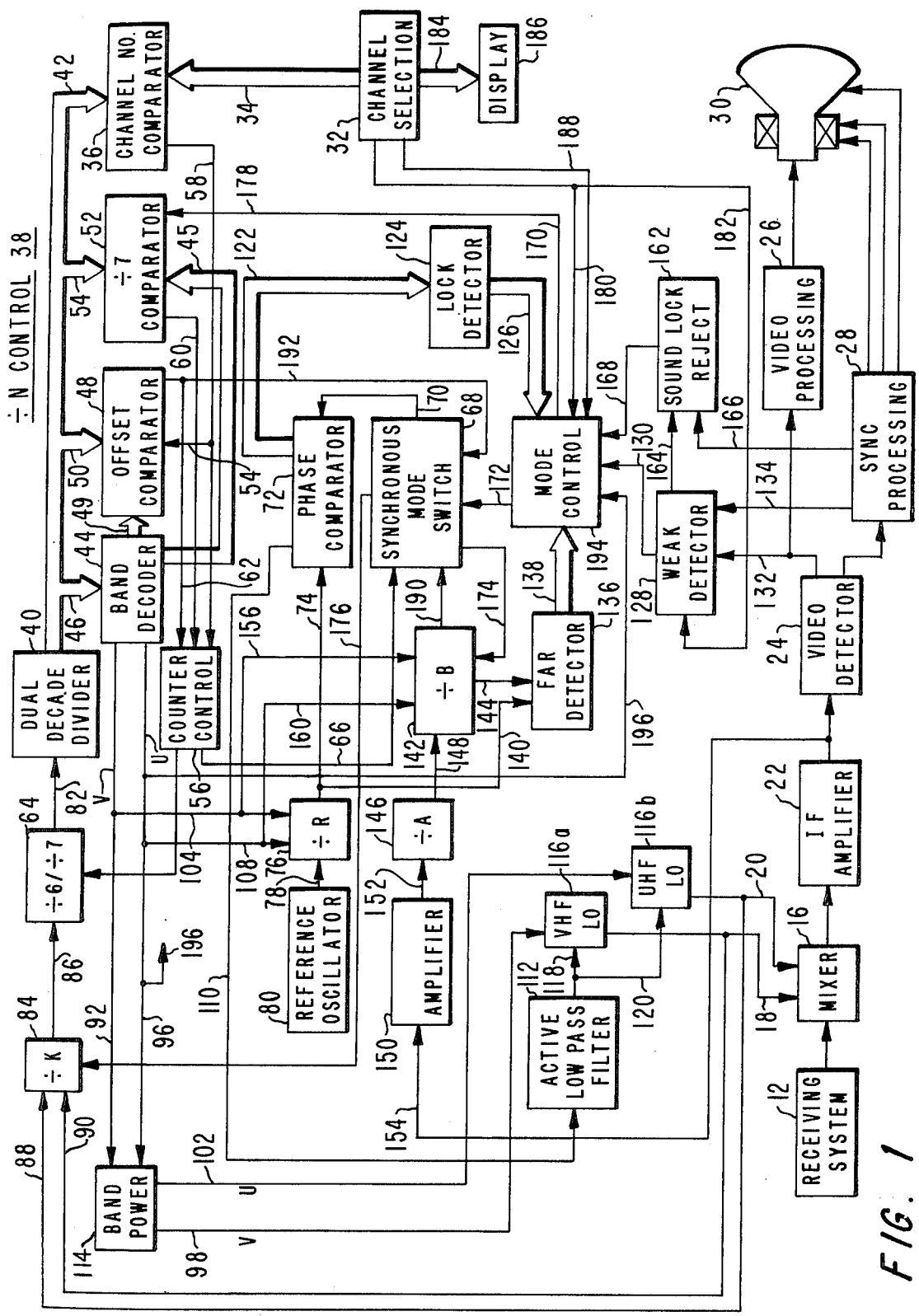
FIG. 1 is a block diagram of a television receiver including tuning apparatus constructed in accordance with the present invention.
Figure 5:
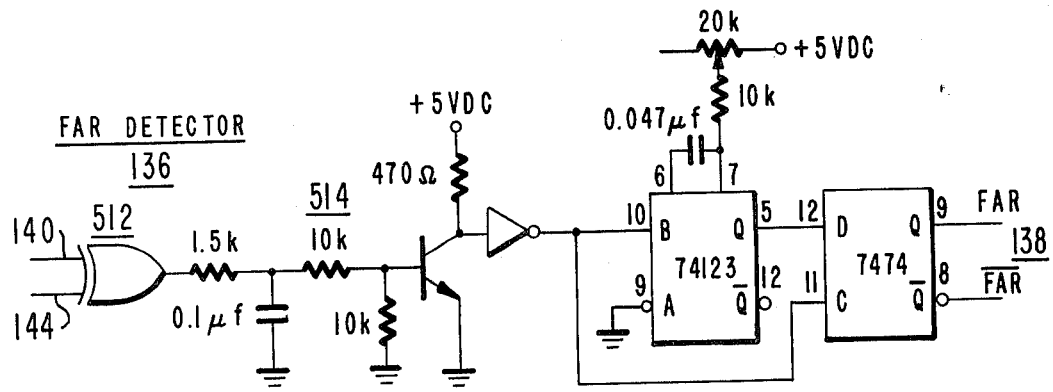
Figure 6:
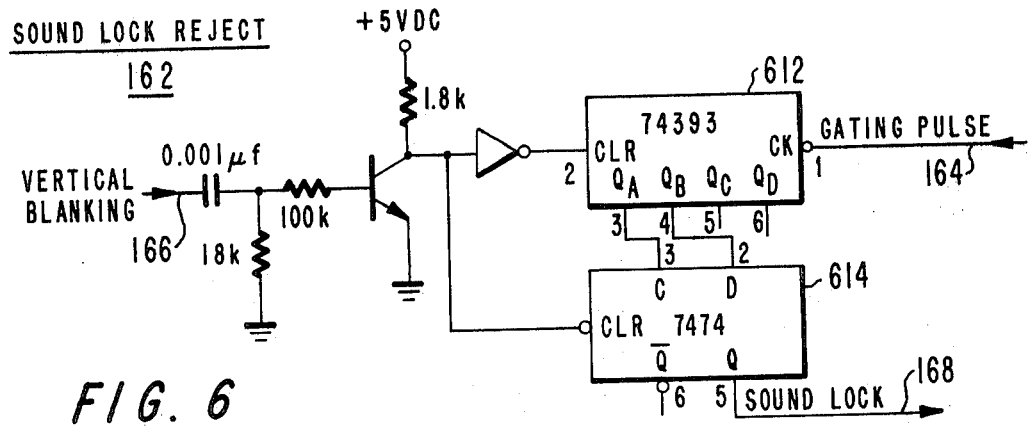
Figure 3:
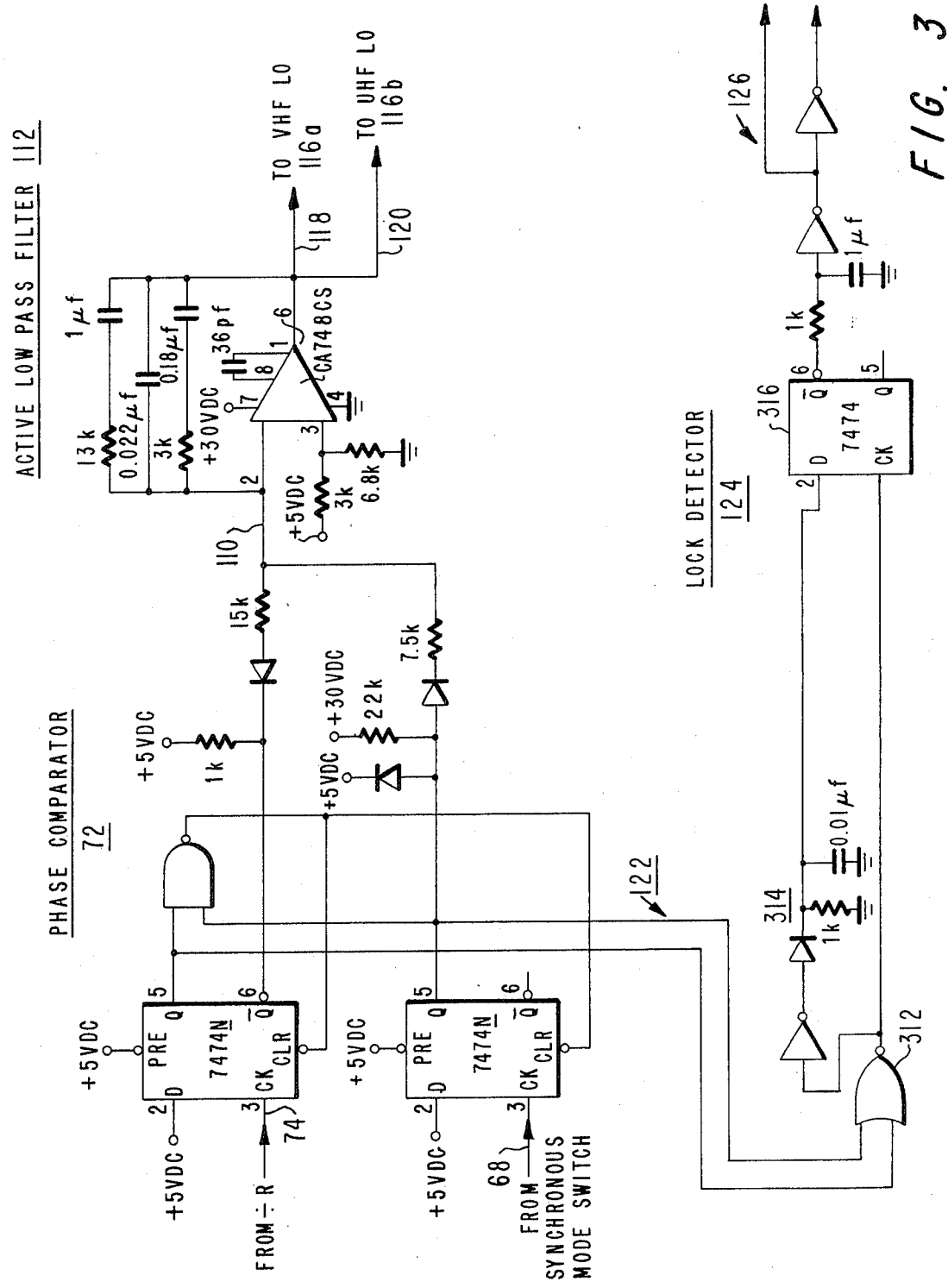
Figure 4:
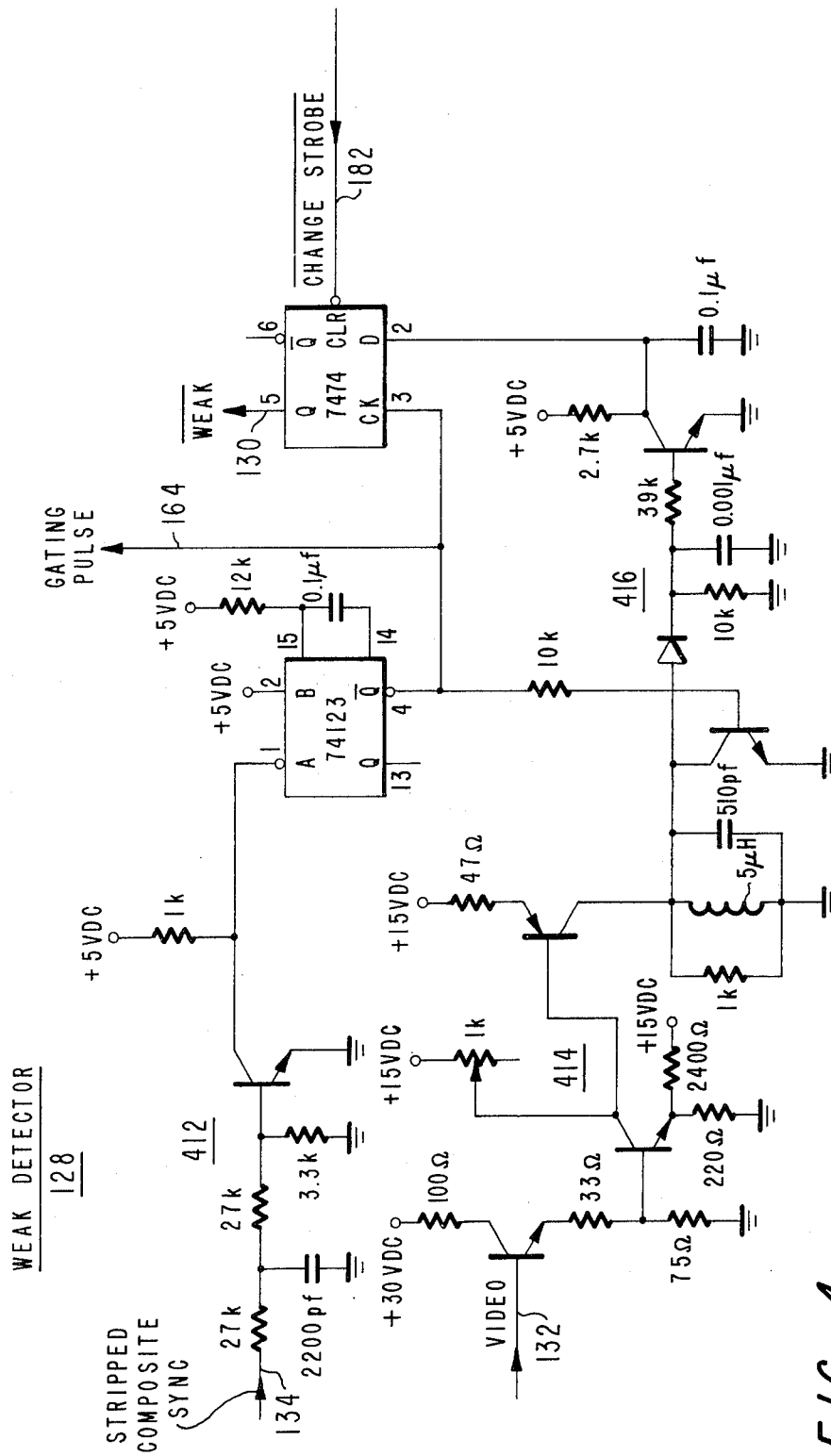
Figure 10:
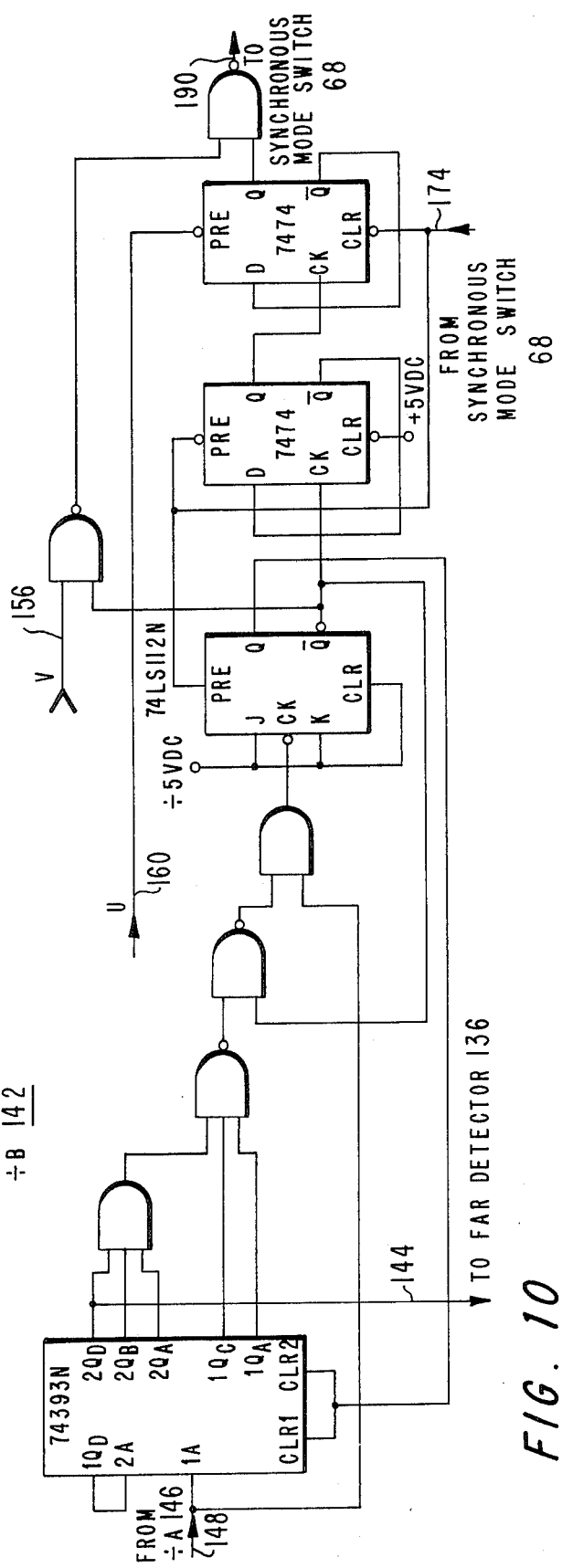

FIG. 3 is a logic diagram of phase comparator 72, active low pass filter 112, and lock detector 124 of FIG. 1;

FIG. 4 is a diagram of weak detector 128 of FIG. 1;

FIG. 5 is a diagram of far detector 136 of FIG. 1;

FIG. 6 is a diagram of sound lock reject unit 162 of FIG. 1;

FIG. 7 is a logic diagram of mode control unit 194 of FIG. 1;

FIG. 8 is a graphic representation of a timing diagram useful in understanding the operation of the apparatus of FIG. 1;

FIG. 9 is a logic diagram of synchronous mode switch 68 of FIG. 1;

FIG. 10 is a logic diagram of divide by B divider 142 of FIG. 1; and

Figure 11:
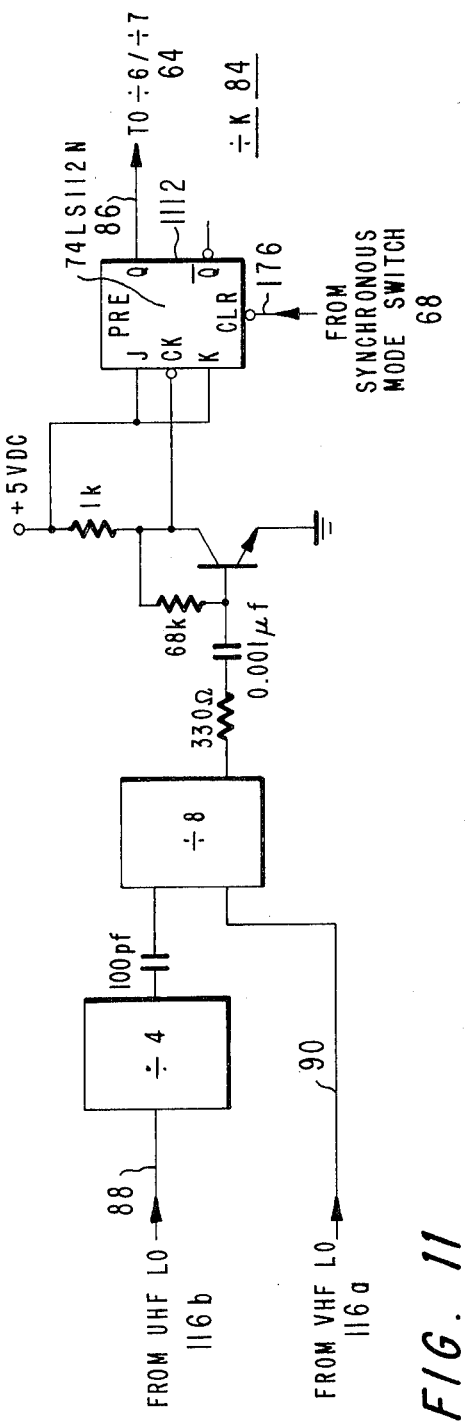

FIG. 11 is a logic diagram of divide by K divider 84 of FIG. 1.

In the receiver shown in FIG. 1, a receiving system 12 is arranged for receiving standard frequency off-the-air broadcast signals as well as nonstandard frequency MATV, CATV or other frequency converted signals.

The received modulated RF carriers are coupled to a mixer 16. Mixer 16 combines the amplified RF carrier with a local oscillator signal coupled to it via either a conductor 18 or a conductor 20 from local oscillator (LO) 116 to form an intermediate frequency (I.F.) signal with a picture carrier at a predetermined fixed frequency, e.g., 45.75 MHz. Either a VHF (very high frequency) portion 116a or a UHF (ultra high frequency) portion 116b of local oscillator 116 is rendered operative, in accordance with the frequency band the selected channel is in, to provide the appropriate range of frequencies.

The I.F. signal is amplified by an I.F. amplifier 22, the output of which is coupled to a video detector 24. Video detector 24 demodulates the amplified I.F. signal to form, for example, luminance-chrominance, and synchronizing signal components which are coupled, respectively, to a video processing unit 26 and to a synchronization (sync) processing unit 28. Sound processing apparatus (not shown) coupled to I.F. amplifier 22 is also provided.

The portions of the receiver thus far described correspond to conventional circuits which, for example, may be of the type employed in the CTC-68 color television receiver described in RCA Color Television Service Data, File 1974 C5, published by RCA Corporation, Indianapolis, Indiana.

The remaining portion of the receiver of FIG. 1 comprises apparatus for automatically tuning the receiver to a selected channel whether receiving system 12 is supplied with modulated carriers at standard or nonstandard frequencies.

A viewer selects a channel by means of a channel selection unit 32 which, for example, comprises a calculator type keyboard for converting decimal channel numbers into binary coded decimal (BCD) signals. The BCD signals are coupled to a display unit 186 to provide a visual indication of the selected channel.

The BCD channel number signals are also coupled via a conductor path 34 to a channel number comparator 36 of a divide by N control unit indicated generally by the reference numeral 38. As will become apparent, unit 38, in addition to providing the divide by N function of the phase locked loop portion of the tuning apparatus, provides other functions such as bandswitching control, i.e., generating control signals dependent on the frequency band in which the selected channel resides. Divide by N control unit 38 is described in detail in my concurrently filed U.S. Patent Application Ser. No. 662,097, entitled, Programming Unit for a Television Tuning Phase Locked Loop, now U.S. Pat. No. 4,009,439, issued Feb. 22, 1977, which is assigned to the same assignee as the present invention and is hereby incorporated into the present application by reference.

Divide by N control unit 38 is included in one of the two phase locked loops of the tuning apparatus. A first tuning phase locked loop, for providing local oscillator signals having frequencies corresponding to the nominal or standard frequency carriers allocated to the various channels, includes a reference frequency oscillator 80, a divide by R divider 76, a phase comparator 72, an active low pass filter 112, local oscillator 116, a divide by K prescaler 84, and divide by N control unit 38. A second or fine tuning phase locked loop configuration, for controlling the local oscillator signal to minimize the frequency deviation between the actual picture carrier of the I.F. signal and the nominal frequency of the I.F. picture carrier (e.g., 45.75 MHz), includes reference frequency oscillator 80, divide by R divider 76, phase comparator 72, active low pass filter 112, local oscillator 116, mixer 16, I.F. amplifier 22, an amplifier 150, a divide by A divider 146, and a divide by B divider 142.

It is noted that the two loops include, as common elements, reference frequency oscillator 80, divide by R divider 76, phase comparator 72, active low pass filter 112, and local oscillator 116. The remaining portions of the two loops are selectively coupled to the common elements through a synchronous mode switch 68 in response to control signals generated by a mode control unit 194. Mode control unit 194 is, in turn, responsive to control signals from a lock detector 124, a weak detector 128, a far detector 136 and a sound lock reject unit 162 whose functions will subsequently be explained.

When a channel is selected by a viewer, channel selection unit 32 couples CHANGE and $\overline{\text{CHANGE}}$ STROBE pulse signals to mode control unit 194 via conductors 188 and 180, respectively, to reset mode control unit 194. In response, mode control unit 194 couples a control signal (via a conductor 172) to synchronous mode switch 68 to cause switch 68 to couple the output signal of divide by N control unit 38 (at conductor 66) to one input of phase comparator 72 (via a conductor 70).

The other input of phase comparator 72 is supplied from the output of programmable divide by R divider 76 via a conductor 74. Divide by R divider 76 divides the frequency of a reference signal generated by reference oscillator 80 by a number depending on which band the selected channel is in, in response to band-switching control signals 104 and 108 provided by band decoder 44 of divide by N control unit 38.

Phase comparator 72 derives an error signal comprising a series of pulses whose average amplitude is related to the phase and frequency deviation between the output signal of divide by N control unit 38 and the output signal of divide by R divider 76. The output signal of phase comparator 72 is coupled via a conductor 110 to active low pass filter 112 where it is filtered and amplified to provide a DC control voltage for the VHF and UHF portions of voltage controlled oscillator 116 via respective conductors 118 and 120.

Depending on which band the selected channel is in, only one of the two portions of local oscillator 116 is activated in response to control signals coupled to it from power unit 114 of divide by N control unit 38 via conductors 98 and 102.

The output terminals of VHF portion 116a and UHF portion 116b of the local oscillator are coupled to separate input terminals of divide by K prescaler 84 via respective conductors 90 and 88. Prescaler 84 divides the frequency of local VHF oscillator signals by 16 and divides the frequency of UHF local oscillator signals by 64 (i.e., 4 × 16). The number K is selected to provide signals to divide by N control unit 38 which have frequencies compatible with its operating characteristics.

The output signal of prescaler 84 is coupled to divide by N control unit 38 via a conductor 86. Divide by N control unit 38 divides the frequency of the output signal of prescaler 84 by a number N equal to the frequency, in MHz, of the local oscillator signal corresponding to the selected channel. In such a configuration, when the local oscillator signal corresponding to the selected channel is combined with a standard frequency R.F. carrier, an I.F. signal having a picture carrier at a nominal frequency (e.g., 45.75 MHz) is produced.

Reference oscillator 80 typically may comprise a 4 MHz crystal oscillator. In that case, when the selected channel is in the lower VHF band (channels 2-6) or in the upper VHF band (channels 7-13), divide by R divider 76 is set to divide by 64 to provide an output at 62.5 KHz. For a selected channel in the UHF band (channels 14-83), divide by R divider 76 is set to divide by 4 × 64 or 256 to provide an output at 15.65 KHz.

Initially, when a channel is selected by the viewer and programmable divide by N control unit 38 and programmable divide by R divider 76 have been set, the local oscillator begins to oscillate at an arbitrary frequency (e.g., at some midrange point in the selected band). The frequency of operation of the local oscillator is modified in response to the DC control signal developed by active low pass filter 112 until the error output signal provided by phase comparator 72 manifests that there is substantially no phase or frequency difference between the output signals of divide by N control unit 38 and divide by R divider 76. At this time, the first phase locked loop provides a local oscillator signal to mixer 16 having a frequency, $f_{LO}$, related to the reference frequency, $f_{REF}$, generated by reference oscillator 80 by the expression:

$$f_{LO} = NK/R \, f_{REF} \qquad (1)$$

If the R.F. carrier provided by receiving system 12 is sufficiently close (e.g., ±50 KHz) to the standard carrier frequency associated with the selected channel (as would be the case for standard broadcast reception), the operation of the first phase locked loop is sufficient to tune the local oscillator. The first phase locked loop will typically provide an I.F. signal having a picture carrier within ±10 KHz of the nominal picture carrier (e.g., 45.75 MHz). Any deviation is primarily attributable to the frequency tolerance of the crystal reference oscillator 80.

When certain additional conditions occur, as will be subsequently explained, mode control unit 194, in response to control signals from lock detector 124, far detector 136, weak detector 128 and sound lock rejection unit 162, generates a control signal to cause synchronous mode switch 68 to couple the output of divide by B divider 142 to one input of phase comparator 72. In that case, the second phase locked loop controls the frequency of the local oscillator to automatically fine tune the receiver, i.e., decrease the frequency deviation between the actual I.F. picture carrier and the nominal I.F. picture carrier (e.g., 45.75 MHz).

In the second phase locked loop, an output of I.F. amplifier 22 is coupled via a conductor 154 and an amplifier 150 to divide by A divider 146. Divide by A divider 146, for the values of $f_{REF}$, R and K given by way of example in this specification, divides the frequency of the amplified I.F. signal by 4 and couples the divided signal via a conductor 148 to divide by B divider 142. Divide by B divider 142, for the values of $f_{REF}$, R, K and A given herein, divides the frequency of the output of divide by A divider 146 by 183 when the selected channel is in the VHF band and by 732 (i.e., 4 × 183) when the selected channel is in the UHF band. The modulus of divide by B divider 142 is controlled in response to bandswitching control signals coupled to it via conductors 156 and 160 from band decoder 44 of divide by N control unit 38 in a manner similar to the bandswitching control of divide by R divider 76.

It is noted that the values of K, N, A and B are chosen so that the ratio of $f_{LO}/K \times N$ and the ratio of the nominal value of the I.F. picture carrier (e.g., 45.75 MHz) and A × B are each equal to the ratio of the frequency of the reference frequency signal and R when the local oscillator is properly fine tuned.

Phase comparator 72 develops an error signal representing the phase and frequency deviation between the output signal of divide by R divider 76 and the output signal of divide by B divider 142 which is filtered and amplified by active low pass filter 112 to control the frequency of the local oscillator.

To initiate the operation of the second PLL, lock detector 124 is coupled to phase comparator 72 via a multiple conductor path 122 and generates a LOCK control signal when the operative loop is locked (i.e., error signal less than a predetermined level) and a $\overline{\text{LOCK}}$ (the logic complement of LOCK) control signal when it is not locked, such signals being coupled to mode control unit 194 via a multiple conductor path 126.

Weak detector 128 is coupled to an output of video detector 24 via a conductor 132 and to an output of synchronization signal processing unit 28 via a conductor 134 and determines when the average amount of noise present in the video signal during the vertical retrace interval is below a predetermined threshold level in order to provide an indication of signal strength. Weak detector 128 provides a $\overline{\text{WEAK}}$ control signal to mode control unit 194 via a conductor 130 when the received R.F. signal has an amplitude, for example, above a level of 50 microvolts. Weak detector 128 inhibits the operation of the second phase locked loop under weak signal conditions because divide by A divider 146 and divide by B divider 142 may not operate properly when relatively high amounts of noise are present in the I.F. signal.

It is noted that when MATV or CATV signals are received, the R.F. signal amplitude will be relatively high, typically in the range of 1 millivolt, and under these conditions weak detector 128 typically provides a $\overline{\text{WEAK}}$ output. It is further noted that when off-the-air broadcast carriers are being provided by receiving system 12, a WEAK signal may be generated, thereby inhibiting the operation of the second phase locked loop configuration. However, under these conditions, the second phase locked loop configuration is not required since the carriers are at standard frequencies.

A far detector 136 is coupled to the output of divide by R divider 76 via a conductor 140 and to the output of divide by B divider 142 via a conductor 144 and determines whether or not the actual picture carrier of the I.F. signal is within a predetermined range of the standard I.F. picture carrier. Far detector 136 generates FAR and $\overline{\text{FAR}}$ control signals when the I.F. picture carrier is, for example, respectively greater or less than 2 MHz away from the standard I.F. picture carrier. These control signals are coupled to mode control unit 194 via a multiple conductor path 138.

Sound lock reject unit 162 is coupled to weak detector 128 via a conductor 164 and to sync processing unit 28 via a conductor 166 to determine if the signal which is provided by divide by B divider 142 is related to a sound carrier rather than to a picture carrier. If the signal provided by divide by B divider 142 is related to a sound carrier such as, for example, the lower adjacent sound carrier, sound lock reject unit 162 generates a SOUND LOCK control signal which is coupled to mode control unit 194 via a conductor 168.

As was previously noted, when a viewer selects a channel, the first phase locked loop configuration adjusts the frequency of the local oscillator 116 toward the nominal local oscillator frequency corresponding to the standard frequency carrier associated with the selected channel. When lock is achieved as determined from the output of phase comparator 72, lock detector 124 generates a LOCK control signal. At this point the control signal from the far detector 136 is examined in the mode control unit 194.

Assuming the presence of a LOCK control signal, a $\overline{\text{FAR}}$ control signal indicates that there may be an I.F. carrier within ±2 MHz of 45.75 MHz. Assuming the presence of both LOCK and $\overline{\text{FAR}}$ control signals, the control signal from the weak detector is next examined in the mode control unit 194. A WEAK control signal indicates that either no signal at all or a weak off-the-air broadcast signal is being provided by receiving system 12. In either case, the tuning operation is complete and the operation of the second phase locked loop is not initiated.

However, a $\overline{\text{WEAK}}$ control signal, in conjunction with both LOCK and $\overline{\text{FAR}}$ control signals, indicates that a strong off-the-air broadcast or frequency-error-prone MATV or CATV signal is being provided by receiving system 12. In this case the tuning operation is switched to its second mode. Mode control unit 194 will cause the output of divide by N control unit 38 (at conductor 66) to be decoupled from phase comparator 72 and will instead couple the output of divide by B divider 142 to it. Thereafter, the second or fine tuning phase locked loop configuration will adjust the frequency of the local oscillator to minimize the frequency deviation between the actual I.F. picture carrier and 45.75 MHz.

It should be noted that although it was stated above that a $\overline{\text{FAR}}$ control signal is generated when there is a carrier within ±2 MHz of 45.75 MHz, if a tuning apparatus is employed in a receiver wherein the frequency response of the I.F. circuits is asymmetrical about 45.75 MHz such that frequency components above 45.75 MHz are attenuated relative to frequency components below 45.75 MHz, and if far detector 136 has generated a FAR (rather than a $\overline{\text{FAR}}$) control signal, two possibilities exist. Either there is no picture carrier within ±2 MHz of 45.75 to which to tune the local oscillator for the selected channel, or the picture carrier is located above, for example, 46.25 MHz but still below 47.75 MHz. To take account of the latter possibility, when LOCK and FAR control signals have been generated, mode control unit 194 generates a STEP control signal and coupled it to a divide by 7 divider 52 of divide by N control unit 38 via a conductor 178.

The STEP control signal causes N to be decremented by two. Since the operation of the second phase locked loop configuration has not been initiated at this point, the output signal of divide by N control unit 38 is still coupled to phase comparator 72 and the first phase locked loop configuration will adjust the frequency of the local oscillator to a frequency corresponding to a carrier frequency 2 MHz lower than the standard frequency carrier associated with the selected channel. As a result, all I.F. carriers are shifted downward 2 MHz in frequency, and a picture carrier which had been between 46.25 MHz and 47.75 MHz will now be within the passband of the I.F. circuits. After this coarse tuning is achieved, lock detector 124 again generates a LOCK control signal.

At this point, if an actual picture carrier had been present in the upper portion of the I.F. range, weak detector 128 will generate a $\overline{\text{WEAK}}$ control signal and far detector 136 will generate a $\overline{\text{FAR}}$ control signal. In response to the LOCK, $\overline{\text{WEAK}}$ and $\overline{\text{FAR}}$ control signals, mode control unit 194 causes the output signal of divide by B divider 142 to be coupled to the input of phase comparator 72 rather than the output signal of divide by N control unit 38. Thereafter, the second or fine tuning phase locked loop adjusts the frequency of the local oscillator to minimize the frequency deviation between the actual I.F. picture carrier and 45.75 MHz.

It is possible that a sound carrier (associated with either the selected channel or the adjacent lower channel) could temporarily attain a sufficiently high amplitude and cause the fine tuning phase locked loop configuration to erroneously tune the receiver to such a sound carrier. As noted earlier, sound lock reject unit 162 generates a SOUND LOCK control signal when the second phase locked loop has tuned the receiver to a sound carrier. In response to the SOUND LOCK control signal, mode control unit 194 re-initiates the tuning sequence by inhibiting the operation of the fine tuning phase locked loop and initiating the operation of the first phase locked loop. In this manner, a condition which may have caused the temporarily high amplitude of the sound carrier will have time to abate and proper tuning in the manner previously set forth above may be accomplished.

Transmission aberrations due to, for example, airplane flutter and switching from one transmitter to another, in addition to momentarily causing a sound carrier to achieve a sufficiently high amplitude to cause the second phase locked loop to lock the local oscillator to it, may cause a loss of lock. This is manifested by the generation of a $\overline{\text{LOCK}}$ control by lock detector 124. In response to the $\overline{\text{LOCK}}$ control signal, mode control unit 194 re-initiates the tuning sequence by inhibiting the operation of the second phase locked loop and initiating the operation of the first phase locked loop.

When a channel is tuned, the first transfer of control to the fine tuning phase locked loop causes the state of the STEP control signal 178 to be preserved in mode control unit 194. Thus, if for a reason such as loss of signal the tuning sequence may be re-initiated, the coarse tuning phase locked loop tunes in accordance with the preserved state of the STEP control signal 178 and no change of state of the STEP control signal is permitted. The state is preserved until a new channel request has been entered. This state preservation minimizes the tuning recovery time and reduces the possibility of erroneous tuning.

It should be noted that at the time when the operation of the first phase locked loop is inhibited and the operation of the fine tuning phase lock loop is initiated, lock detector 124 may provide a $\overline{\text{LOCK}}$. This does not necessarily indicate an error condition and should not cause the tuning sequence to be re-initiated. Therefore, during the switching interval mode control unit 194 will not respond to a $\overline{\text{LOCK}}$ control signal. Furthermore, rather than utilizing lock detector 124 during the switching interval between the first and fine tuning phase locked loops, far detector 136 is utilized to determine if loss of lock has occurred due to some aberration. Since prior to initiating the operation of the fine tuning phase locked loop, a $\overline{\text{FAR}}$ control signal must be generated, if during the switching interval a FAR control signal is generated, indicating that the actual picture carrier has been driven (due to a transient or the like) further than 2 MHz from 45.75 MHz, the operation of the fine tuning phase locked loop will be inhibited and the operation of the first phase locked loop will be re-initiated.

Furthermore, since UHF signals are not subject to the MATV and CATV frequency translation errors, a control signal indicating that a UHF channel has been selected is coupled to mode control unit 194 from divide by N control circuit 38 via a conductor 196 to prevent the initiation of the operation of the second phase locked loop when a UHF channel has been selected.

In order to initially synchronize the operation of the second phase locked loop with the operation of the first phase locked loop when the operation of the second phase lock is initiated, an offset match pulse is coupled to synchronous mode switch 68 via a conductor 192. Synchronous mode switch 68 also initially synchronizes the operation of the first phase locked loop with the operation of the second phase locked loop when the operation of the first phase locked loop is initiated after the operation of the second phase locked loop.

This synchronous switching operation may best be understood by concurrent reference to FIGS. 8, 9, 10 and 11. FIG. 8 shows various waveforms associated with synchronous mode switch 68. FIGS. 9, 10 and 11, respectively, show logic implementations of syncrhonous mode switch 68, divide by B divider 142, and divide by K prescaler 84.

In FIG. 8, three intervals of the operation of the tuning apparatus of FIG. 1 are shown; namely when the first phase locked loop is locked (labelled COARSE MODE LOCKED), when the second phase locked loop goes from an unlocked to a locked condition (labelled FINE MODE UNLOCKED TO LOCKED), and an interval in which the first phase locked loop tunes the local oscillator after a channel has been changed (labelled COARSE MODE AFTER CHANNEL CHANGE). When the first phase locked loop is locked, the leading edges of the divide by N and the divide by R output signals are in synchronism whereas the leading edges of divide by B and the divide by R output signals are not in synchronism. This is because while the first phase locked loop is running closed loop with respect to reference oscillator 80, the second phase locked loop is operating open loop with respect to reference oscillator 80. Therefore, if the divide by B output signal were coupled to phase comparator 72 without initial instantaneous synchronization between the divide by B output signal and the divide by R output signal, it is conceivable, and likely, that the tuning voltage provided local oscillator 116 by phase comparator 72 could cause an undue delay before the second phase locked loop achieved lock. Therefore, the logic of synchronous mode switch 68 instantaneously synchronizes the leading edge of the first pulse of the divide by B output signal applied to phase comparator 72 with the leading edge of the divide by N output signal (which is at the point still in synchronism with the divide by R output signal) when the operation of the second phase locked loop is initiated.

Instantaneous synchronization of the divide by B output signal and the divide by N output signal when operation of the second phase locked loop is first initiated is accomplished in the following manner. While the first phase locked loop is operating, the Q output of a D-type flip-flop 916 of synchronous mode switch 68 is at a logic "1" while its $\overline{Q}$ output is at a logic "0". The Q and $\overline{Q}$ outputs of D-type flip-flop 916 are coupled to "and" gates 924 and 926, respectively. As a result, the output signal of divide by N control circuit 38 (at conductor 66) is coupled through enabled "and" gate 924 to phase comparator 72 while the output signal of divide by B divider (at conductor 190) is inhibited from reaching phase comparator 72 because of disabled "and" gate 926. Furthermore, an input 920 of "nand" gate 912 of synchronous mode switch 68 is at a logic "1" because it is coupled to the Q output of D-type flip-flop 916.

When the correct conditions to cause the initiation of the operation of the second phase locked loop, as previously described, are detected by mode control unit 194, a logic "1" is coupled to another input 918 of "nand" gate 912 and to the set input 928 of a cross-coupled set-reset flip-flop 914 of synchronous mode switch 68. In response, set-reset flip-flop 914 generates a logic "0" which is coupled to the D input of D-type flip-flop 916. However, the state of D-type flip-flop 916 is not changed until the application of the next positive-going pulse to its clock (CK) input.

Since, at this point, inputs 918 and 920 of "nand" gate 912 are both at logic "1's", when a positive-going OFFSET MATCH pulse is applied to the third input 922 of "nand" gate 912, a negative-going pulse is generated by "nand" gate 912 and a logic "0" is coupled via conductor 174 to divide by B divider 142. In response, divide by B divider 142 is cleared and stops counting.

When the negative-going pulse generated by "nand" gate 912 terminates in response to the termination of the OFFSET MATCH pulse, the logic "0" previously applied to conductor 174 is removed and divide by B divider 142 again begins to count. However, the output pulses of divide by B divider 142 are not coupled through synchronous mode switch 68 to phase comparator 72 since, at this point, the Q output of D-type flip-flop 916 is still at a logic "1" while its $\overline{Q}$ output is at a logic "0". As a result, the divide by N output signal is still coupled to the output of synchronous mode switch 68.

Since the output of synchronous mode switch 68 (at conductor 70) is coupled to the CK input of D-type flip-flop 916, the next positive-going edge of the divide by N output signal causes the signal at the D input of D-type flip-flop 916, a logic "0", to be entered. In response, the Q output of D-type flip-flop 916 becomes a logic "0" and its $\overline{Q}$ output becomes a logic "1". In response, "and" gate 926 is enabled and "and" gate 924 is disabled, thereby decoupling the divide by N output signal from phase comparator 72 and coupling the divide by B output signal to phase comparator 72 instead.

The above-described initial instantaneous synchronization of the divide by B output signal with divide by N output signal, when the operation of the second phase locked loop is terminated, is illustrated in FIG. 8 at the dotted line labelled "SWITCH FROM COARSE TO FINE MODE". It is seen that the divide by B output signal is synchronous with the divide by N output signal at the time when the operation of the first phase locked loop is terminated and the operation of the second phase locked loop is begun. Since the divide by N output signal has already been synchronized to the divide by R output signal during the operation of the first phase locked loop, the divide by B output signal is initially synchronized with the divide by R output signal. Thereafter, the synchronization of the divide by B output signal and the divide by R output signal is under the control of the second phase locked loop as previously described. This is illustrated in the portion of FIG. 8 labelled "FINE MODE UNLOCKED TO LOCKED".

Synchronous mode switch 68 initially instantaneously synchronizes the divide by N output signal with the divide by R output signal when the operation of the first phase locked loop is initiated and the operation of the second phase locked loop is inhibited to avoid undue delay due to an initially incorrect error signal in the following manner. While the second phase locked loop is operating, the Q output of D-type flip-flop 916 is at a logic "0" and divide by B output signal is coupled through enabled "and" gate 926 to phase comparator 72. Furthermore, the logic "0" at the Q output of D-type flip-flop 916 is coupled to the clear (CLR) input of JK flip-flop 1112 of divide by K prescaler 84. As a result, no input pulses are provided to the divide by N control circuit 38 during the operation of the second phase locked loop and the output of the divide by N circuit 38 remains at a logic "1".

When a viewer selects a new channel or when there has been a temporary loss of lock in response to a temporary aberration, mode control unit 194 couples a logic "0" to set input 928 of set-reset flip-flop 914 via conductor 172. In response, the output of the set-reset flip-flop 928, which is coupled to the D-input of D-type flip-flop 916, becomes a logic "1". However, the logic "1" at the D-type input to the D-type flip-flop 916 is not entered until the next positive-going pulse is applied to the clock (CK) input of D-type flip-flop 916. Since at this point the input of phase comparator 72 (at conductor 70) and, therefore, the clock input of D-type flip-flop 916, is still coupled to the output of divide by B divider 142, the next positive-going pulse applied to the D input of D-type flip-flop 916 is provided by the divide by B output signal.

When the logic "1" at the D input of D-type flip-flop 916 is entered in response to the next positive-going pulse of the divide by B output signal, the Q output of the D-type flip-flop 916 becomes a logic "1" and the $\overline{Q}$ output of the D-type flip-flop 916 becomes a logic "0". In response, the clear signal is removed from divide by K prescaler 84 and divide by N output circuit 38 starts to count pulses of the input signal again. Simultaneously, "and" gate 924 is enabled and "and" gate 926 is disabled, thereby coupling the divide by N output signal to phase comparator 72 and decoupling the divide by B output signal from phase comparator 72. Thus, the divide by N output signal is started and simultaneously coupled to phase comparator 72 in synchronism with the first pulse of the divide by B output signal after mode control unit 194 has generated a command signal to cause the first phase locked loop to begin its operation. This synchronous switching operation is illustrated in the portion of FIG. 8 labelled "COARSE MODE AFTER CHANNEL CHANGE".

Figure 2:
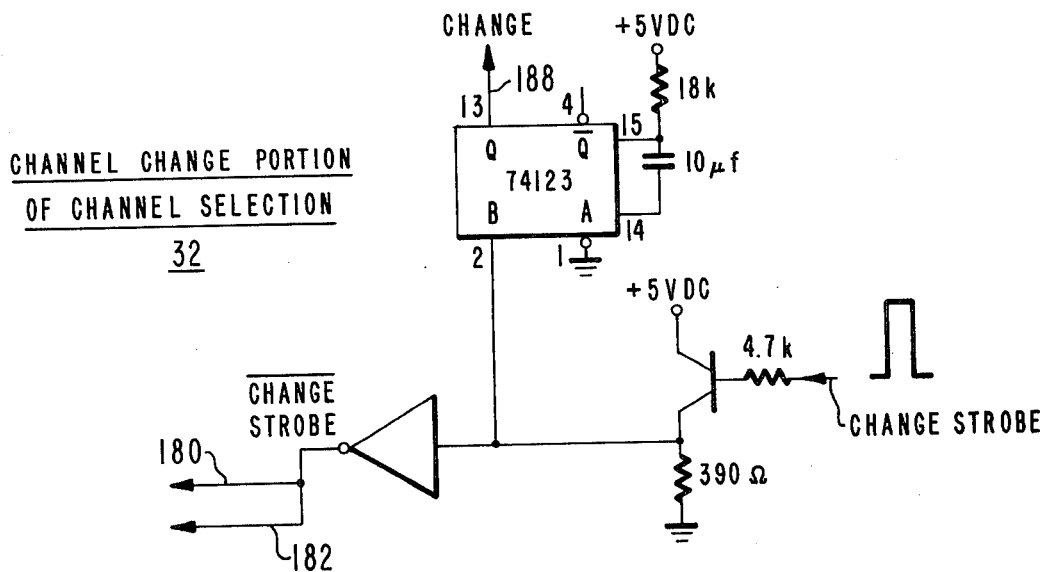
FIG. 2 is a logic diagram of a portion of channel selection unit 32 of FIG. 1.

Referring now to FIG. 2, there is shown a logic implementation of a portion of channel selection unit 32. When a viewer selects a new channel, another portion (not shown) of channel selection unit 32 generates a CHANGE STROBE pulse which is processed to form its complement $\overline{\text{CHANGE STROBE}}$, and another pulse, CHANGE, of longer duration. These pulses are coupled to mode control unit 194 and weak detector 128 to reset their logic. The implementation shown in FIG. 2 utilizes a conventional logic inverter and an integrated circuit monostable multivibrator.

In FIG. 3 there is shown logic implementations of phase comparator 72, active low pass filter 112 and lock detector 124. Phase comparator 72 comprises two D-type integrated circuit flip-flops. The D-type flip-flops are respectively responsive to the output signals of divide by R divider 76 and the output signal of synchronous mode switch 68 and are arranged with their outputs coupled to a summing point (at conductor 110) to provide a pulse signal having pulses whose widths depend on the instantaneous phase and frequency difference between the output signal of divide by R divider 76 and the output signal of synchronous mode switch 68. The pulse signal is integrated by active low pass filter 112, comprising, for example, an integrated circuit operational amplifier available from RCA Corporation with the part number as indicated, to form the control voltage for local oscillator 116.

The signals developed at the Q outputs of the D-type flip-flops comprising phase comparator 72 are coupled to a "nor" gate 312 of lock detector 124 which sums them. The resultant sum signal is inverted and peak detected by a peak detector 314. If the resultant sum signal includes pulses whose duration signal is sufficiently long to charge the capacitor of peak detector 314, a positive-going pulse is coupled to the D input of a D-type flip-flop 316. Data is entered into D-type flip-flop and it is set accordingly once every cycle of the sum signal provided by "nor" gate 312. Thus, if the sum signal includes pulses of sufficiently long duration, indicating that lock has not been achieved, the $\overline{Q}$ output is set to a logic "0", whereas if the sum signal does not contain pulses of sufficiently long duration, indicating that lock has been achieved, the $\overline{Q}$ output is set to a logic "1".

In FIG. 4 there is shown an implementation of weak detector 128. An integrator 412 of weak detector 128 is coupled to an output of synchronization processing unit 28 providing a stripped composite synchronization (sync) signal including only the vertical and horizontal sync pulses of the composite video signal derived by video detector 24. Integrator 412 integrates the stripped composite synchronization signal to provide a pulse corresponding to the vertical pulse when a picture carrier is within the passband of the I.F. portion of the receiver. The output of integrator 412 is coupled to a monostable multivibrator which provides a GATING PULSE signal which rises immediately following the vertical pulse.

Weak detector 128 is also responsive to the video signal provided by video detector 24. The video output signal is amplified and bandpass filtered by a circuit 414 to remove synchronization and color components. In response to the GATING PULSE signal, approximately three horizontal lines of the bandpass filtered video signal, during the vertical blanking interval, are coupled to a peak detector circuit 416. If the R.F. signal is strong, the video signal noise content will be relatively low and the peak detected signal derived by circuit 416 will have a relatively low amplitude However, If the R.F. signal is weak, the noise content will be relatively high and the peak detected signal derived by peak detector circuit 416 will have a relatively large amplitude. If the peak detected signal has a sufficiently low amplitude, a D-type flip-flop whose D-input is coupled to the output of peak detector 416 will have its Q output set to a logic "1" to indicate a strong ($\overline{\text{WEAK}}$) signal. Thus, by determining the peak value of noise present during the GATING PULSE interval, weak detector 128 provides an indication of whether a strong or weak video signal is present.

FIG. 5 shows an implementation of far detector 136 responsive to input signals from divide by R counter 76 (at conductor 140) and divide by B counter 142 (at conductor 144). "Exclusive or" gate 512 generates frequency components proportional to the difference frequency between its input signals. Circuitry 514 comprises a low pass filter, an inverting amplifier and an inverter. The output signal of the inverter consists of positive-going pulses whose repetition rate is at the difference frequency between the divide by R output signal and the divide by B output signal. The positive-going transitions of the pulses toggle a retriggerable monostable multivibrator which provides at its Q output a positive-going pulse of predetermined width. The width is chosen such that if the monostable resets prior to the next positive transition at its input, the difference frequency between the I.F. carrier and 45.75 MHz is less than 2 MHz. The output signal of the monostable multivibrator is sampled by a D-type flip-flop clocked by the same pulses which trigger the monostable multivibrator. The Q output of the D-type flip-flop is the FAR control signal, with a "1" signifying that the I.F. carrier is more than 2 MHz displaced from 45.75 MHz.

FIG. 6 shows a logic implementation of sound lock reject unit 162. Sound lock reject unit 162 in essence compares the repetition rate of the GATING PULSE signal generated by weak detector 128 to the repetition rate of the conventional vertical blanking pulse provided by synchronization processing unit 28. If the receiver is tuned to a picture carrier, the repetition rates of the GATING PULSE and the receiver provided vertical blanking pulse are equal. However, if the receiver is locked to a sound carrier, their repetition rates will be unequal and more than one GATING PULSE will be generated per each vertical blanking pulse. Thus, sound lock reject unit 162 includes a counter 612 clocked in response to the GATING PULSE and reset in response to the vertical blanking pulse. If three GATING PULSES are counted between resets, the Q output of a D-type flip-flop 614 is set to a logic "1" (SOUND LOCK), thereby indicating that the receiver is locked to a sound carrier.

FIG. 7 shows an implementation of mode control unit 194 utilizing conventional logic elements, D-type flip-flops, and a monostable multivibrator. The function of mode control unit 194 has been previously explained in detail with reference to its input and output signals and no detailed description of the operation of its logic implementation will be given as it will be readily understood by those skilled in the art by reference to its input and output signals.

It should be appreciated that although the tuning arrangement according to the present invention has been described with reference to the specific embodiment shown in FIG. 1 and implementations of certain portions thereof shown in FIGS. 2–7 and 9–11, modification of the arrangements and implementations is contemplated to be within the scope of the present invention.

In FIGS. 2–7 and 9–11, logic elements which are available in integrated circuit form from Texas Instruments Corporation are identified by their commercial type numbers. In FIG. 11, the divide by 4 divider may be implemented by a Plessy SP8616B integrated circuit and the divide by 8 divider may be implemented by an SP8600B integrated circuit in conjunction with an SP8604B integrated circuit.

Divide by R divider 76 may, for example, comprise a 74393N type integrated circuit counter available from Texas Instruments Corporation.

Although the present tuning apparatus has been described with reference to the NTSC standards utilized in the United States, it should be understood that modifications to the tuning apparatus to make it compatible with standards utilized in other countries are intended to be within the scope of the present invention.

Furthermore, it should be appreciated that although the two phase locked loops of the present tuning apparatus have been described as sharing reference oscillator 80, divide by R divider 76 and phase comparator 72, a tuning apparatus may be constructed in accordance with the present invention wherein two phase locked loop configurations share other elements. For example, the local oscillator signal and the I.F. signal may be selectively coupled to the input of a frequency divider whose output is in turn coupled to a phase comparator. In this case, during the operation of the first phase locked loop configuration, the divider is controlled to divide the frequency of the local oscillator signal (such as is divide by N divider 38) in accordance with the channel selected. During the operation of the second phase locked loop configuration, the divider is controlled (such as is divide by B divider 142) to divide the frequency of the picture carrier component by a number so that the signal coupled to the phase comparator during the operation of the second phase locked loop configuration has substantially the same frequency as does the signal provided to the phase comparator during the operation of the first phase locked loop configuration.

In addition, the two phase locked loops may utilize signals generated elsewhere in the receiver as the reference frequency signal. For example, the 3.58 MHz reference signal used in conjunction with the processing of color signals may be utilized. When the color reference signal is used as the frequency reference for the phase locked loops, A should be preferably selected as 4, B selected as 4026, K selected as 352 and R selected as 1260 for both UHF and VHF channels.

What is claimed is:

1. In a television receiver, apparatus for tuning the receiver to a radio frequency carrier associated with a selected channel comprising:
   means for generating a reference frequency signal;
   phase comparator means including first and second inputs and a frequency control output, said reference frequency signal being coupled to said first input;
   oscillator means coupled to said frequency control output for generating a local oscillator signal;
   means responsive to said local oscillator signal and said radio frequency carrier for generating an intermediate frequency signal including a picture carrier;
   switching control means responsive to said local oscillator signal and to said intermediate frequency signal for selectively providing either a first signal whose frequency equals the frequency of the local oscillator signal divided by a first number corresponding to the selected channel or a second signal including a frequency component proportional to said intermediate frequency picture carrier to said second input of said phase comparator means, the ratio of the frequency of said local oscillator signal and said first number being substantially equal to a nominal value of said frequency component;
   means coupled to said switching control means for supplying control signals thereto when said signals coupled to said first and second inputs of said phase comparator means are in predetermined phase and frequency relationship and the frequency of said frequency component is within a predetermined deviation from its nominal value;

said switching control means initially coupling said first signal to said phase comparator and thereafter decoupling said first signal from said phase comparator and coupling said second signal to said phase comparator in response to said control signals.

2. The apparatus recited in claim 1 wherein said switching control means includes:
first divider means for dividing the frequency of said local oscillator signal by said first number corresponding to the selected channel to derive said first signal;
second divider means for dividing said intermediate frequency signal by a second number to derive said second signal; the ratio of the frequency of said local oscillator signal and said first number being substantially equal to the ratio of said nominal value of said picture carrier and said second number; and
means for selectively coupling said first and second signals to said second input of said phase comparator means.

3. The apparatus recited in claim 1 wherein said means for supplying control signals to said switching control means includes:
channel selection means for controlling said first number in accordance with said selected channel and for generating a change channel control signal when a new channel is selected;
first detector means for generating a lock control signal when the signals coupled to said first and second inputs of said phase comparator means are in a predetermined phase and frequency relationship;
second detector means for generating a near control signal when the frequency of said picture carrier is within a predetermined frequency deviation from its nominal frequency value;
third detector means for generating a strong control signal when said radio frequency carrier has a relatively high amplitude; and
said switching control means initially coupling said first control signal to said phase comparator means in response to the presence of said change channel control signal and thereafter decoupling said first control from said phase comparator means and coupling said second control signal to said phase comparator means solely in response to the presence of all said lock, near and strong control signals.

4. The apparatus recited in claim 3 wherein said predetermined frequency deviation is related to the maximum expected frequency deviation between a standard frequency carrier allocated to said selected channel and a nonstandard frequency carrier associated with said selected channel.

5. The apparatus recited in claim 3 further including fourth detector means for generating a sound lock control signal when the frequency of said second signal is directly related to the frequency of a sound carrier associated with said intermediate frequency signal by the reciprocal of said second number while said second signal is coupled to said phase comparator means; said switching control means decoupling said second signal from said phase comparator means and coupling said first signal to said phase comparator means in response to said sound lock signal.

6. The apparatus recited in claim 3 wherein said first detector is coupled to said phase comparator means.

7. The apparatus recited in claim 3 wherein said second detector means determines the frequency relationship between said second signal and said reference frequency signal; the frequency of said reference frequency being related to said nominal value of the frequency of said picture carrier.

8. The apparatus recited in claim 3 wherein said third detector means includes means for detecting the amplitude of the radio frequency carrier.

9. The apparatus recited in claim 8 wherein said third detector means includes video detector means responsive to said intermediate frequency for generating video signals disposed between synchronization signals; and means for detecting the amplitude of noise in said video signals.

10. The apparatus recited in claim 9 wherein said third detector means includes means for separating said video signals from said synchronization signals to form a resultant signal absent said video signals; means for integrating said resultant signal to form a gating signal; and means for detecting the peak amplitude of noise contained in said vidio signal during said gating signal; said strong control signal being generated when said peak amplitude falls below a predetermined level.

11. The apparatus recited in claim 3 wherein said means for generating said intermediate frequency has an associated amplitude versus frequency passband; and said switching control means generates a step control signal in response to the presence of said lock control signal and the absence of said near control signal, the frequency of said local oscillator means changing by a predetermined amount sufficient to bring said picture carrier within said passband in response to said step control signal.

12. The apparatus recited in claim 11 wherein said switching control means decouples said second signal from said phase comparator means, couples said first signal to said phase comparator means and terminates said step control signal in response to the presence of said change channel control signal; and said switching control means decouples said second signal from said phase comparator means, couples said first signal to said phase control means and maintains said step control signal in response to the absence of said lock control signal.

13. The apparatus recited in claim 11 wherein the frequency of said local oscillator signal is decremented by said predetermined amount.

14. The apparatus recited in claim 13 wherein said first divider means changes the value of said first number in response to the presence of said step signal.

15. The apparatus recited in claim 3 wherein said switching control means decouples said second signal from said phase comparator means and couples said first signal to said phase comparator means in response to the presence of said change channel control signal, the absence of said lock control signal or the absence of said near control signal.

16. The apparatus recited in claim 15 wherein said switching control means includes synchronization means for initially synchronizing said second signal with respect to said frequency reference signal in response to the presence of said lock, near and weak control signals.

17. The apparatus recited in claim 16 wherein said first divider means provides a first pulse signal; said second divider means provides a second pulse signal; said synchronization means is coupled to said second divider means to cause said second divider means to synchronize the generation of the first pulse of the second pulse signal after the generation of said lock, near and strong control signals with the first pulse of said first pulse signal generated after the generation of said lock, near and strong control signals; and said switching control means couples said second pulse signal to said circuit point and decouples said first pulse signal from said circuit point in synchronism with the first pulse of said first pulse signal generated after the generation of said lock, near and strong control signals.

18. The apparatus recited in claim 16 wherein said synchronization means initially synchronizes said first signal with respect to said frequency reference signal in response to the presence of said change channel control signal.

19. The apparatus recited in claim 18 wherein said first divider means provides a first pulse signal; said second divider means provides a second pulse signal; said synchronization means is coupled to said first divider means to cause said first divider means to synchronize the generation of the first pulse signal after the generation of said channel change control signal with the first pulse of said second pulse signal generated after the generation of said change channel control signal; and said switching control means couples said first pulse signal to said circuit point and decouples said second pulse signal from said circuit point in synchronism with the first pulse of said second pulse signal generated after the generation of said change channel control signal.

* * * * *

UNITED STATES PATENT OFFICE
CERTIFICATE OF CORRECTION

PATENT NO. : 4,078,212

DATED : March 7, 1978

INVENTOR(S) : ROBERT MORGAN RAST

It is certified that error appears in the above-identified patent and that said Letters Patent are hereby corrected as shown below:

Column 1, line 11, that portion reading "general" should read -- generate --; Column 2, line 10, that portion reading "clock" should read -- lock --; Column 16, line 24, that portion reading "vidio" should read -- video --.

Signed and Sealed this

Twelfth Day of September 1978

[SEAL]

*Attest:*

RUTH C. MASON
*Attesting Officer*

DONALD W. BANNER
*Commissioner of Patents and Trademarks*